United States Patent
Aga et al.

(10) Patent No.: US 8,058,938 B2
(45) Date of Patent: Nov. 15, 2011

(54) VOLTAGE CONTROLLED OSCILLATOR

(75) Inventors: Arshan Aga, Mountain View, CA (US); Farbod Aram, Los Altos Hills, CA (US)

(73) Assignee: Project FT, Inc., Mountain View, CA (US)

( * ) Notice: Subject to any disclaimer, the term of this patent is extended or adjusted under 35 U.S.C. 154(b) by 94 days.

(21) Appl. No.: 12/799,001

(22) Filed: Apr. 14, 2010

(65) Prior Publication Data

US 2010/0277250 A1  Nov. 4, 2010

Related U.S. Application Data

(60) Provisional application No. 61/215,077, filed on Apr. 30, 2009.

(51) Int. Cl.
*H03B 5/12* (2006.01)
(52) U.S. Cl. .............. 331/117 FE; 331/36 C; 331/185
(58) Field of Classification Search .............. 331/36 C, 331/117 FE, 117 R, 167, 185
See application file for complete search history.

(56) References Cited

U.S. PATENT DOCUMENTS

| | | | |
|---|---|---|---|
| 4,459,496 A | 7/1984 | Yamada et al. | |
| 7,821,349 B2 * | 10/2010 | Park et al. | 331/167 |
| 7,920,030 B2 * | 4/2011 | Jang et al. | 331/45 |
| 2002/0079975 A1 | 6/2002 | Asikainen et al. | |
| 2006/0028283 A1 | 2/2006 | Sze et al. | |
| 2006/0097801 A1 | 5/2006 | Adan | |
| 2007/0182503 A1 | 8/2007 | Petrofsky | |
| 2007/0247237 A1 * | 10/2007 | Mohammadi | 331/36 C |
| 2008/0272851 A1 | 11/2008 | Lin et al. | |

* cited by examiner

*Primary Examiner* — Levi Gannon
(74) *Attorney, Agent, or Firm* — Van Pelt, Yi & James LLP

(57) ABSTRACT

A voltage controlled oscillator (VCO) includes a first and a second n-type transistor, a first and a second p-type transistor, a first and second capacitive element, a bridge connecting (1) the ground-facing connection of the first n-type transistor and power-facing connection of the first p-type transistor to (2) the ground-facing connection of the second n-type transistor and power-facing connection of the second p-type transistor, a first inductive element, a first capacitor bank, a second inductive element, and a second capacitor bank.

19 Claims, 8 Drawing Sheets

VOLTAGE CONTROLLED OSCILLATOR

CROSS REFERENCE TO OTHER APPLICATIONS

This application claims priority to U.S. Provisional Patent Application No. 61/215,077 entitled VOLTAGE CONTROLLED OSCILLATOR WITH COMPLIMENTARY SOURCE COUPLED DIFFERENTIAL PAIRS filed Apr. 30, 2009 which is incorporated herein by reference for all purposes.

BACKGROUND OF THE INVENTION

A voltage controlled oscillator (VCO) is a key component in systems that receive, transmit, or digitize signals. An oscillator has certain specifications that need to be met depending on the application. There are requirements for the frequency range, phase noise or jitter, KVCO, frequency variation due to temperature, power and area. One type of VCO known as an LC tank based VCO has attained widespread use due to its low phase noise characteristic. However, it would be desirable if LC tank based VCO circuits could be further improved, for example with respect to reduction of phase noise at the VCO output.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
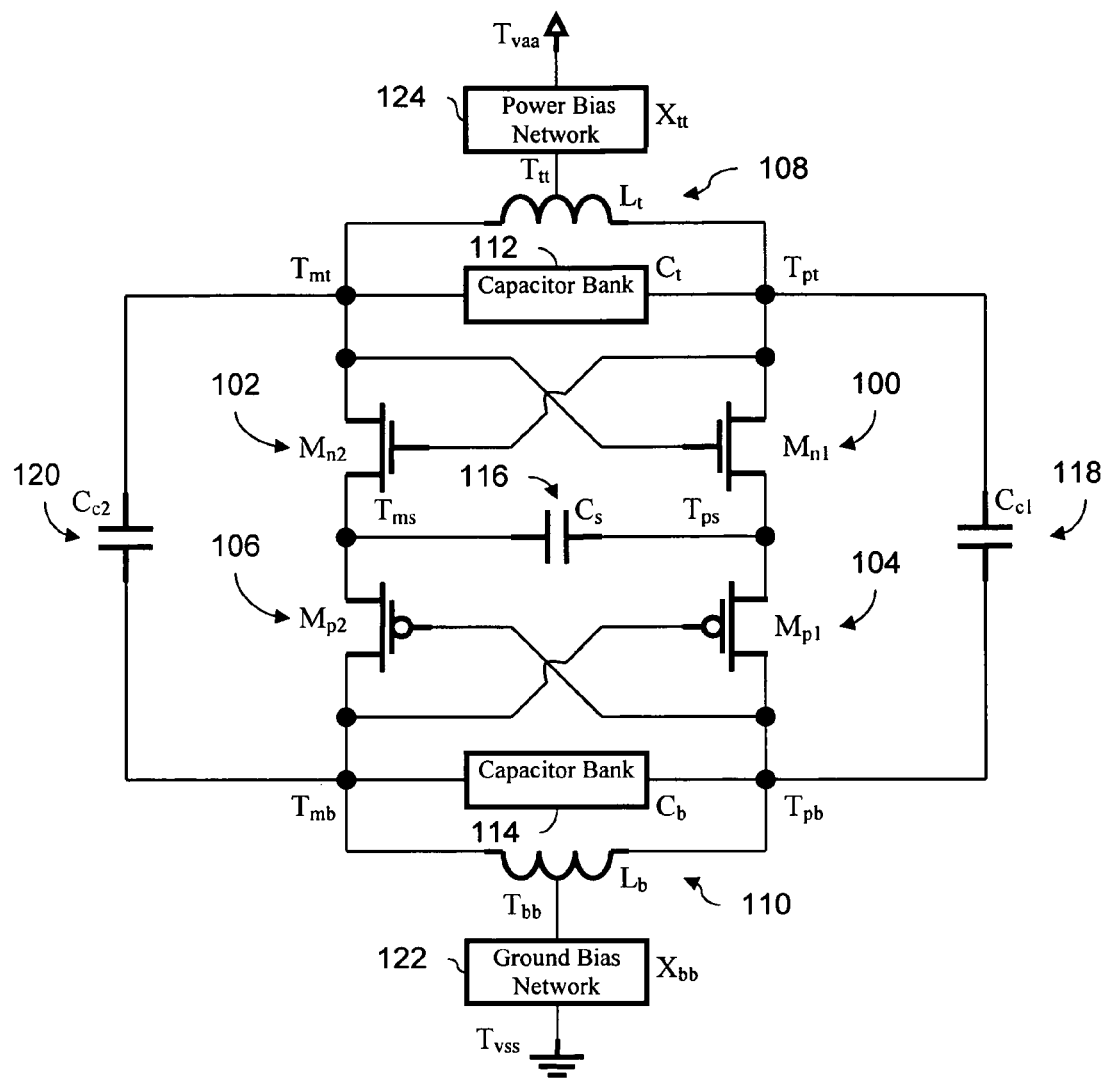
FIG. 1 shows a first embodiment of a voltage-controlled oscillator (VCO) architecture.

FIG. 1 shows a first embodiment of a voltage-controlled oscillator (VCO) architecture. In the example shown, the VCO shown can be used in a variety of ways. For example, an integrated implementation of a VCO is one in which all the components that make up the oscillator are incorporated on a single chip or substrate and the VCO shown can be used in both integrated and non-integrated implementations of a VCO.

In the VCO shown, $M_{n1}$ (100) and $M_{n2}$ (102) are matched n-type transistor elements and $M_{p1}$ (104) and $M_{p2}$ (106) are matched p-type transistor elements. In this example and other examples shown here, a variety of transistor types can be used. The embodiments shown are not (for example) limited to CMOS transistor elements but can also use bipolar transistor elements, GaAs transistor elements or any other transistor elements without compromising the benefits of the circuit. As such, the gate connections described herein may be referred to more generally as the input, drain connections of n-type transistors and source connections of p-type transistors may be referred to more generally as power-facing connections (i.e., because they face "upwards" towards power), and source connections of n-type transistors and drain connections of p-type transistors may be referred to more generally as ground-facing connections (i.e., because they face "downwards" towards ground).

$L_t$ (108) and $L_b$ (110) are inductive elements with a center tap and are implemented as single inductors in this example. In various embodiments, inductive elements 108 and 110 may or may not be matched to one another. They also may or may not have coupling to one another (i.e., in at least some embodiments they have a mutual inductance component). This coupling (if any does exist) may be in either orientation. In at least some applications, the circuit is oriented to have current in $L_t$ (108) flowing from node $T_{pt}$ to node $T_{mt}$ to induce a current in $L_b$ (110) from node $T_{pb}$ to node $T_{mb}$. In some embodiments, the inductor elements are physically implemented in a form to maximize the mutual inductance and/or minimize the area requirement. An example of this is described in further detail below.

$C_t$ (112) and $C_b$ (114) are capacitor banks. In various embodiments, one or both of these capacitor banks are simple capacitive elements or alternatively may be a combination of parallel or serial capacitive elements (e.g., that may be programmable either by updating some digital input or analog input to the capacitor bank that would alter the capacitance). In some embodiments, capacitor bank 112 and/or 114 include(s) a varactor element (i.e., a capacitive element whose capacitance changes by updating an analog input). A capacitance bank may be implemented in a variety of ways. A first example implementation creates a capacitance between the two nodes of the capacitor bank. A second example implementation creates a capacitance between each of the nodes and a fixed low impedance node (i.e., ground, power, low impedance bias, etc.).

$C_s$ (116) is a capacitive element and is one example of a bridge. As used herein, a bridge can be anything connecting one part of a circuit to another part of the circuit. In this particular example, the bridge includes a single capacitor (i.e., $C_s$ 116). In various embodiments, a bridge includes any passive network that creates some impedance between two nodes. In this embodiment the bridge creates an impedance between nodes $T_{ps}$ and $T_{ms}$. In some embodiments, $C_s$ (116) is removed altogether and the bridge is a direct connection (i.e., nodes $T_{ps}$ and $T_{ms}$ are connected directly together). A variety of bridges may be employed while maintaining the benefits of this circuit.

$C_{c1}$ (118) and $C_{c2}$ (120) are capacitive elements. In various embodiments they can be replaced by any passive network connecting nodes $T_{pt}$ to $T_{pb}$ and $T_{mt}$ to $T_{mb}$, respectively, without altering the overall benefits of this circuit.

$X_{bb}$ (122) is a ground bias network which can be implemented as any pull-down network. In one example, it is as simple as a direct connection to a low impedance node (i.e., a direct connection to a low supply or ground or a low impedance circuit like a voltage regulator). It another example, it is a connection to a fixed low impedance node via any combination of passive elements. In some embodiments, such a pull down network is also a network that sinks current from the VCO to the low impedance node. This current may be fixed, may vary with temperature, process or some other parameter that is external to the VCO, or may be controlled by a feedback network that regulates the VCO output swing or the bias voltage at any of the nodes in the VCO structure. If a low impedance voltage element is used (e.g., a voltage regulator), the voltage may be fixed or a feedback network may be used that regulates the current through the transistor elements so as to maintain a certain VCO output swing or a bias voltage at any of the nodes in the VCO structure.

$X_{tt}$ (124) is a power bias network. This block can be any pull-up network. In one example, it is as simple as a direct connection to a low impedance node (e.g., a direct connection to a high supply or power or a low impedance circuit like a voltage regulator). In another example it may be a connection to a fixed low impedance node via any combination of passive elements. This pull up network may also be a network that sources current to the VCO from the low impedance node. This current may be fixed, may vary with temperature, process or some other parameter that is external to the VCO, or may be controlled by a feedback network that regulates the VCO output swing or the bias voltage at any of the nodes in the VCO structure. If a low impedance voltage element is used (e.g., a voltage regulator), the voltage may be fixed or a feedback network may be used that regulates the current through the transistor elements so as to maintain a certain VCO output swing or a bias voltage at any of the nodes in the VCO structure.

The node $T_{mt}$ has connections to a first side of $L_t$ (108), a first side of $C_t$ (112), the gate of $M_{n1}$ (100), the drain of $M_{n2}$ (102), and a first side of $C_{c2}$ (120). The node $T_{pt}$ has connections to a second side of $L_t$ (108), a first side of $C_{c1}$ (118), the drain of $M_{n1}$ (100), the gate of $M_{n2}$ (102), and a second side of $C_t$ (112). The node $T_{ms}$ has connections to the source of $M_{n2}$ (102), a first side of $C_s$ (116), and the source of $M_{p2}$ (106). The node $T_{ps}$ has connections to the source of $M_{n1}$ (100), the source of $M_{p1}$ (104), and the second side of $C_s$ (116). The node $T_{mb}$ has connections to the drain of $M_{p2}$ (106), the gate of $M_{p1}$ (104), a first side of $C_b$ (114), a first side of $L_b$ (110), and a second side of $C_{c2}$ (120). The node $T_{pb}$ has connections to the drain of $M_{p1}$ (104), a second side of $C_{c1}$ (118), a second side of $L_b$ (110), a second side of $C_b$ (114), and the gate of $M_{p2}$ (106). Although the connections described above use the terms gate, source, and drain, the technique is not necessarily limited to transistor types having those types of connections. The technique can be implemented using any transistor type.

The output of the VCO may be taken as a single-ended output from any of nodes $T_{pt}$, $T_{mt}$, $T_{pb}$, $T_{mb}$ or it may be a differential output taken as a differential voltage between nodes $T_{pt}$ and $T_{mt}$ (i.e. $T_{pt}-T_{mt}$ or $T_{mt}-T_{pt}$) or as a differential voltage between nodes $T_{pb}$ and $T_{mb}$ (i.e. $T_{pb}-T_{mb}$ or $T_{mb}-T_{pb}$). The output may further be taken as some mathematical combination of the voltages at these four nodes which includes the scaled version of the voltages at these four nodes, one simple example would have the output be $a_1*V(T_{pt})-a_2*V(T_{mt})+a_3*V(T_{pb})-a_4*V(T_{mb})$ where $a_1$, $a_2$, $a_3$ and $a_4$ are all coefficients that may be real numbers or imaginary numbers and V( ) signifies the voltage of what is in the brackets. This embodiment is not limited to the output taken as a linear combination of the above four voltages, the output may instead be taken as any mathematical operation of the voltage at these four nodes whether linear or non-linear and may include real or imaginary coefficients.

Furthermore, the output may be taken as a single current that flows through inductive element $L_t$ (108) or $L_b$ (110) or it may be taken as some mathematical combination of these two currents which may be linear of non-linear and may include real or imaginary coefficients. This may be done by incorporating transformers into the design. This transformer may be used to induce a scaled version of the current that flows through $L_t$ (108) or $L_b$ (110) or a mathematical combination of these currents into another inductive element and this induced current may be the output.

There are a number of benefits to the VCO shown herein and in later figures. Some benefits are:

Phase noise performance: Some other architectures have n-type transistor elements only, p-type transistor elements only, or both n-type and p-type transistor elements that contain current source elements located at the source nodes of the n-type and/or p-type transistor elements. Such current source elements generate noise that manifests itself at the VCO output as phase noise and thus hurts the phase noise performance of the VCO. This circuit and others shown herein are not so configured and therefore have better phase noise performance.

Redirection/diversion of noise: Another benefit is the impedance elements connecting nodes $T_{pt}$ to $T_{pb}$ and $T_{mt}$ to $T_{mb}$, respectively (shown in FIG. 1 as $C_{c1}$ (118) and $C_{c2}$ (120)) act as a low impedance path that can be used to divert the noise energy created by the transistor elements away from the LC tank. Thus, it helps to further reduce the phase noise seen at the output of the VCO. These can be replaced by any passive network that provides a low impedance at a particular frequency of interest.

Figure 2:
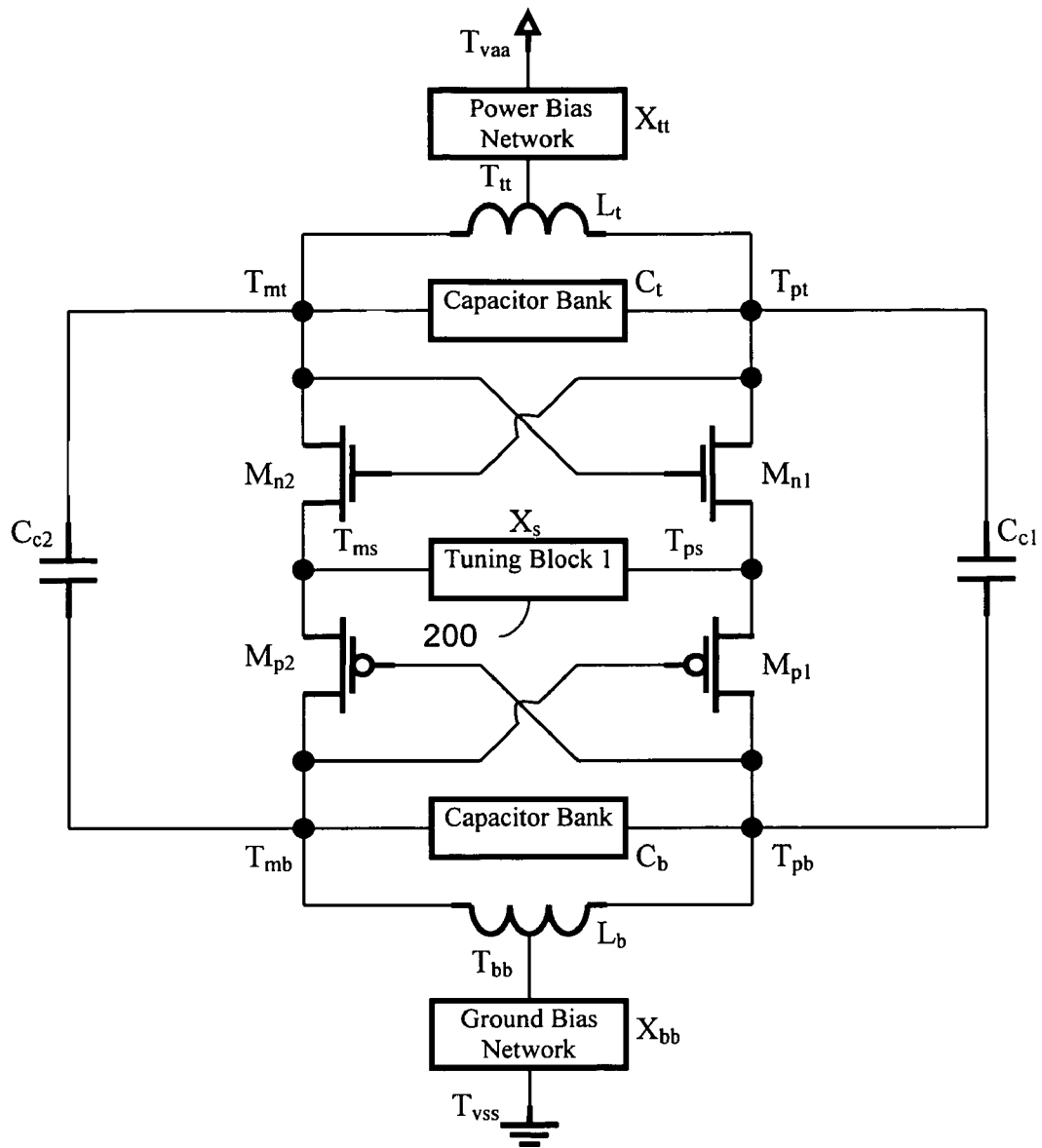
FIG. 2 shows an embodiment of a VCO with a tuning block as the bridge.

Noise rejection at select frequency(ies): Another benefit to the architecture shown is the impedance element connecting nodes $T_{ps}$ and $T_{ms}$, shown as $C_s$ (116) in FIG. 1. This capacitive element can be replaced (if desired) by a frequency selective passive network (an embodiment of this is shown in FIG. 2). In some applications, this network is designed or otherwise configured to create a low impedance at the VCO frequency of oscillation but a high impedance at other frequencies. The configuration in FIG. 1 is one example of this and in this case allows the circuit to reject a large amount of low frequency noise generated by the transistor elements via the use of $C_s$ (116), $C_{c1}$ (118) and $C_{c2}$ (120).

This figure and other figures are merely exemplary and the technique can be implemented in a variety of ways. For example, the capacitive elements shown in this figure (e.g., $C_s$ (116), $C_{c1}$ (118) and $C_{c2}$ (120)) and other figures are not necessarily limited to capacitors but may be any form of a passive network that is predominantly or substantially capacitive in nature (e.g., creates a capacitive coupling between the two ends of the network). In some embodiments, the capacitance implementation within this element can be implemented using Metal-Insulator-Metal (MIM) capacitors, Metal-Oxide-Metal (MOM) capacitors, Poly-Poly capacitors, junction diode capacitance or any other form of capacitance creating a capacitive coupling between two nodes. Similarly, the inductor elements in this figure (e.g., $L_t$ (108) and $L_b$ (110)) and other figures are not limited to a single inductor but may be any form of a passive network that is predominantly or substantially inductive in nature. In some embodiments, these inductors are replaced by transformers and the current induced in the secondary coils of these transformers can be used in some operation to help enhance the output of the circuit without changing the fundamental operation of this circuit or other circuits shown herein. In some embodiments, these secondary coils may be configured to aid in flux cancellation techniques again without altering the noise benefits of the architecture.

FIG. 2 shows an embodiment of a VCO with a tuning block as the bridge. In the example shown, the circuit shown in FIG. 2 is similar to that shown in FIG. 1 except $C_s$ (116) in FIG. 1 is replaced by a tuning block (200). This architecture provides all the benefits of FIG. 1, plus has the additional benefit of tuning block $X_s$ (200). Tuning block $X_s$ (200) acts to provide further noise improvements by being programmed or otherwise configured to have a low impedance at the frequency of oscillation and a high impedance at one or more other frequency bands where noise rejection is important. One example of this improvement is that if transistor elements $M_{n1}$ (100), $M_{n2}$ (102), $M_{p1}$ (104) and $M_{p2}$ (106) generate noise at a particular frequency (let's call it $f_{noise}$), $X_s$ (200) can be configured to be high impedance at this frequency and lower the ability of $f_{noise}$ to manifest itself at the VCO output relative to the oscillation frequency. Therefore, the noise seen at the VCO output at frequencies ($f_{osc}-f_{noise}$) and ($f_{osc}+f_{noise}$) would be suppressed, where $f_{osc}$ is the frequency of oscillation of the VCO.

This technique of employing a tuning block as the bridge between nodes $T_{ms}$ and $T_{ps}$ to reject noise at certain frequency bands is not limited to the circuits shown in FIGS. 1 and 2.

In various embodiments, a tuning block can implemented as a frequency selective block (e.g., a band pass, band reject, low pass, high pass, multi band pass, multi band reject, or some combination of these) or as a simple passive component or combination of passive components that creates an impedance between the two nodes of the tuning block. This impedance may be a constant value over frequency (such as a resistor) or frequency selective in nature. In some embodiments, tuning block 200 is programmable so noise rejection can be adjusted as desired and/or if the frequency of oscillation changes.

Figure 3:
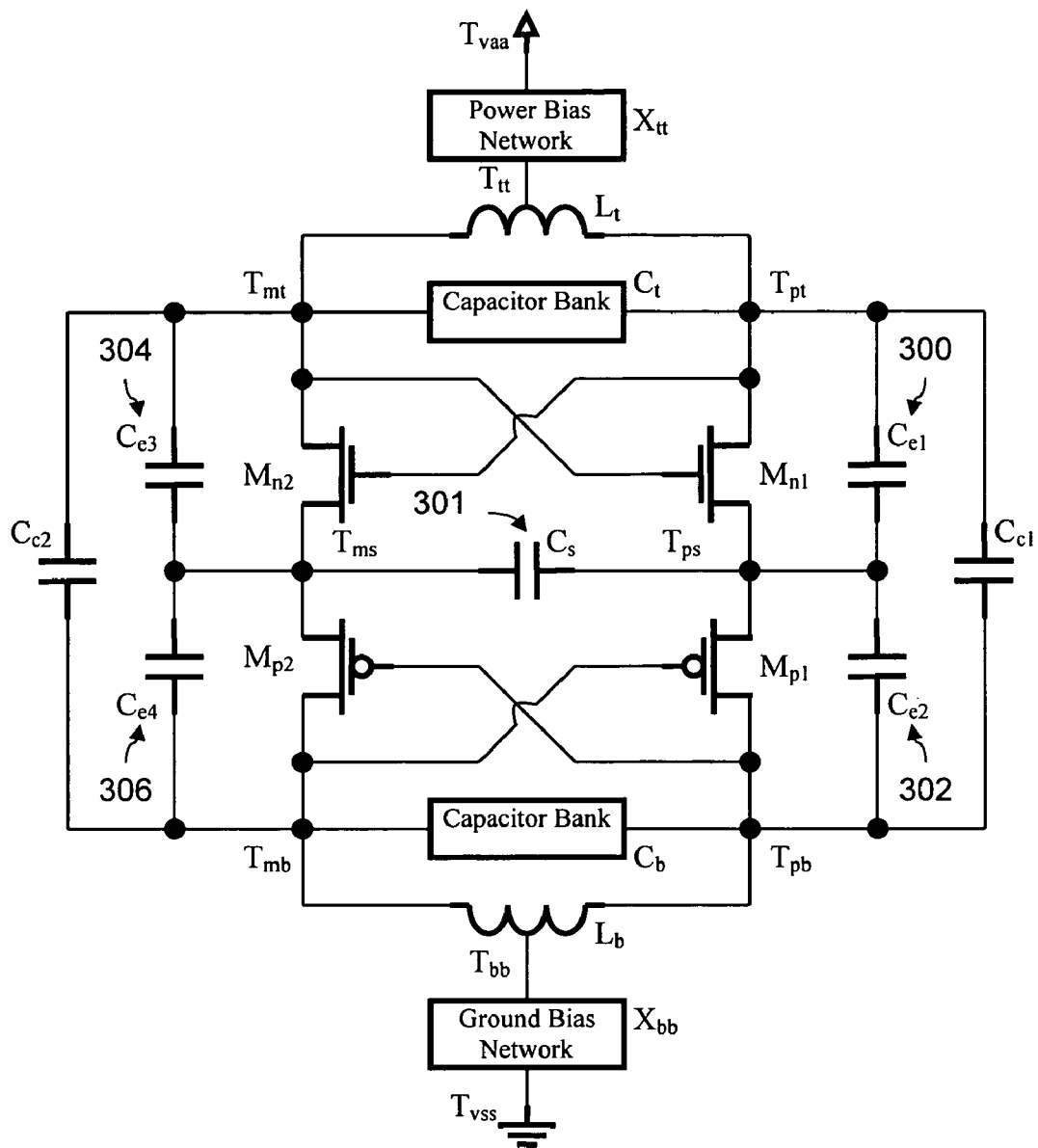
FIG. 3 shows an embodiment of a VCO configured to have improved transconductance.

FIG. 3 shows an embodiment of a VCO configured to have improved transconductance. In the example shown, the VCO shown in FIG. 3 is similar to that shown in FIG. 1, except for the addition of capacitive elements $C_{e1}$ (300), $C_{e2}$ (302), $C_{e3}$ (304), and $C_{e4}$ (306). Before these capacitors are added, the designer designs the VCO to oscillate under some set of conditions (e.g., some temperature range, some process variation, some parameter variation, etc.). This requires a certain value of transconductance requirement from the transistor element (gm1).

By adding capacitive elements $C_{e1}$ (300), $C_{e2}$ (302), $C_{e3}$ (304), and $C_{e4}$ (306), the effective transconductance (gm1_eff) achieved by the circuit increases from that in FIG. 1 even though the transconductance of the transistor element remains unchanged:

gm1_eff>gm1

With the addition of those capacitive elements, the designer is now able to lower the inherent transconductance to a new value (gm1_new) such that the new effective transconductance (gm1_eff_new) is the same as the old inherent transconductance. Hence:

gm1_new<gm1 gm1_eff_new=gm1

The lower inherent transconductance results in lower noise generated by the transistor while providing the same level of margin for VCO oscillation to occur.

Capacitors $C_{e1}$ (300), $C_{e2}$ (302), $C_{e3}$ (304), and $C_{e4}$ (306) further provide an alternative path for the noise generated by the transistor elements to propagate and therefore provide an extra level of phase noise improvement in the VCO.

Figure 4:
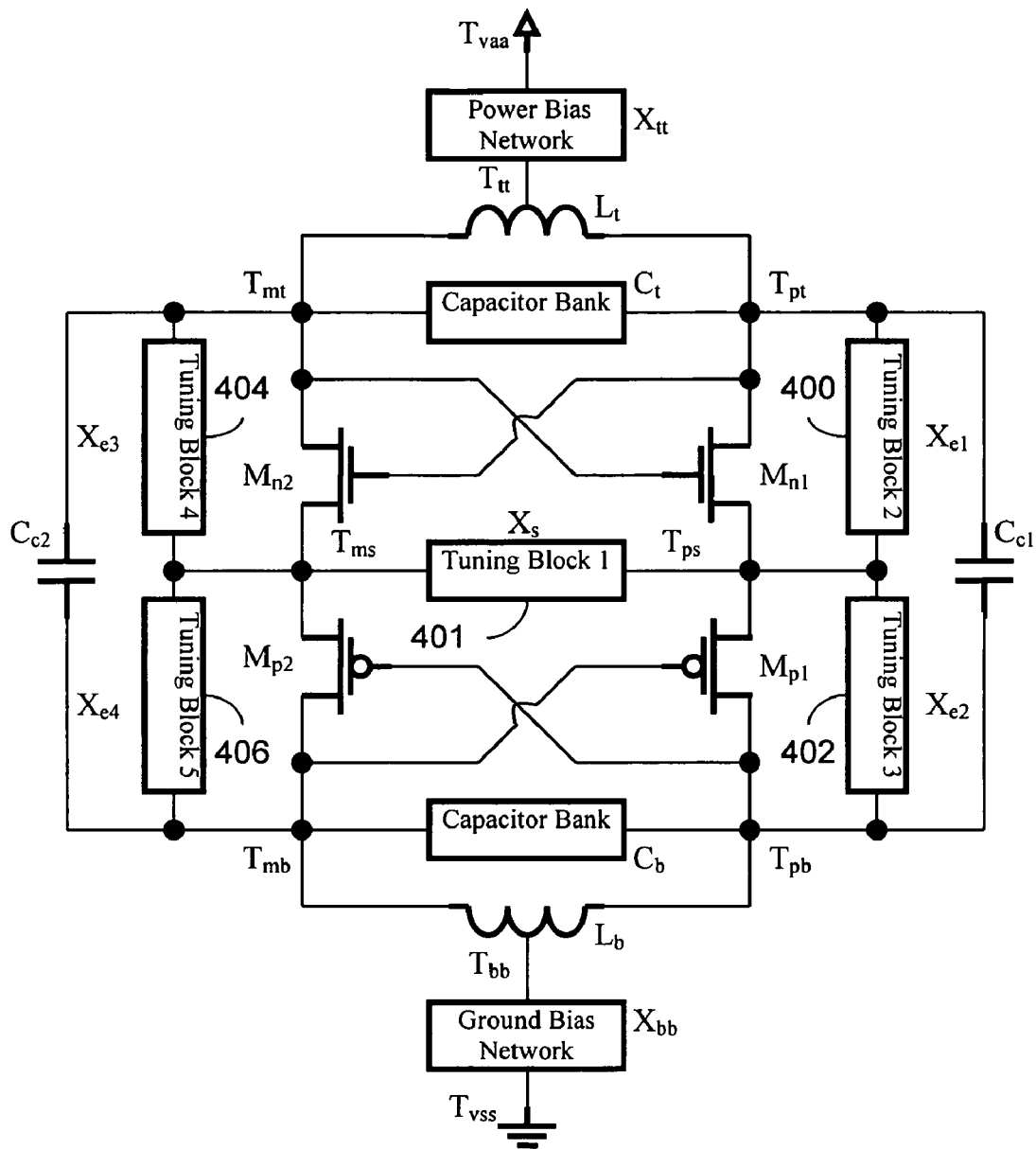
FIG. 4 is a diagram showing an embodiment of a VCO with multiple tuning blocks.

FIG. 4 is a diagram showing an embodiment of a VCO with multiple tuning blocks. In the example shown, FIG. 4 shows a similar version of the circuit shown in FIG. 3. $C_s$ (301), $C_{e1}$ (300), $C_{e2}$ (302), $C_{e3}$ (304), and $C_{e4}$ (306) in FIG. 3 have been replaced by tuning blocks $X_s$ (401), $X_{e1}$ (400), $X_{e2}$ (402), $X_{e3}$ (404), and $X_{e4}$ (406), respectively. The tuning blocks in FIG. 4 allow the designer the ability to have a low or high impedances for these tuning blocks at the frequency or frequency band of interest and a low or high impedance at other frequencies or frequency bands where noise is a concern.

Figure 5:
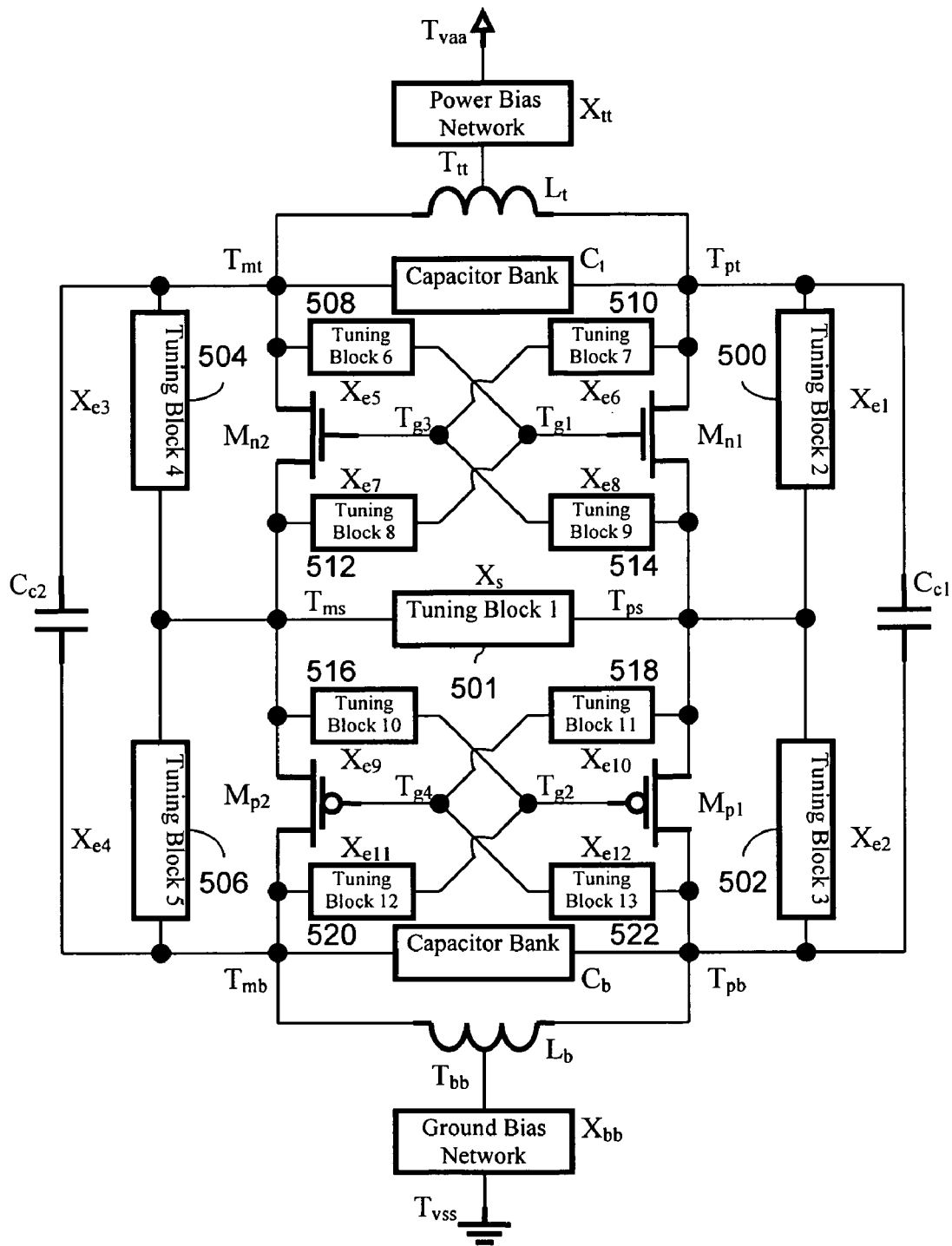
FIG. 5 is a diagram showing an embodiment of a VCO with even more tuning blocks than the previous figure.

FIG. 5 is a diagram showing an embodiment of a VCO with even more tuning blocks than the previous figure. Tuning blocks $X_s$ (501), $X_{e1}$ (500), $X_{e2}$ (502), $X_{e3}$ (504), $X_{e4}$ (506), $X_{e5}$ (508), $X_{e6}$ (510), $X_{e7}$ (512), $X_{e8}$ (514), $X_{e9}$ (516), $X_{e10}$ (518), $X_{e11}$ (520), and $X_{e12}$ (522) allow the designer even more flexibility to have a low or high impedances for these tuning blocks at the frequency or frequency band of interest and a low or high impedance at other frequencies or frequency bands where noise is a concern. This structure allows the ratio of the signals from both the source and drain of the opposing NMOS and PMOS transistor to be coupled to the gate of the other NMOS and PMOS. The designer may then use this ratio to raise or lower the effective transconductance of the transistors while allowing for additional paths of noise cancellation through the various tuning blocks. Furthermore, by coupling the noise from the source and drain of one side to the gate of the other side, some of this noise can be converted to common-mode. This common mode noise can be made to see a low impedance at the LC tank (i.e. the output of the VCO) and therefore this noise will be suppressed.

In this embodiment, some tuning blocks may be chosen to be removed all together and a high impedance or some residual parasitic impedance may be created between the two nodes without altering the essence of the embodiment.

In some embodiments, there is some bias circuitry that provides a voltage bias to nodes $T_{g1}$, $T_{g2}$, $T_{g3}$, and $T_{g4}$ for those situations where these nodes would otherwise be floating from a DC point of view.

Figure 6:
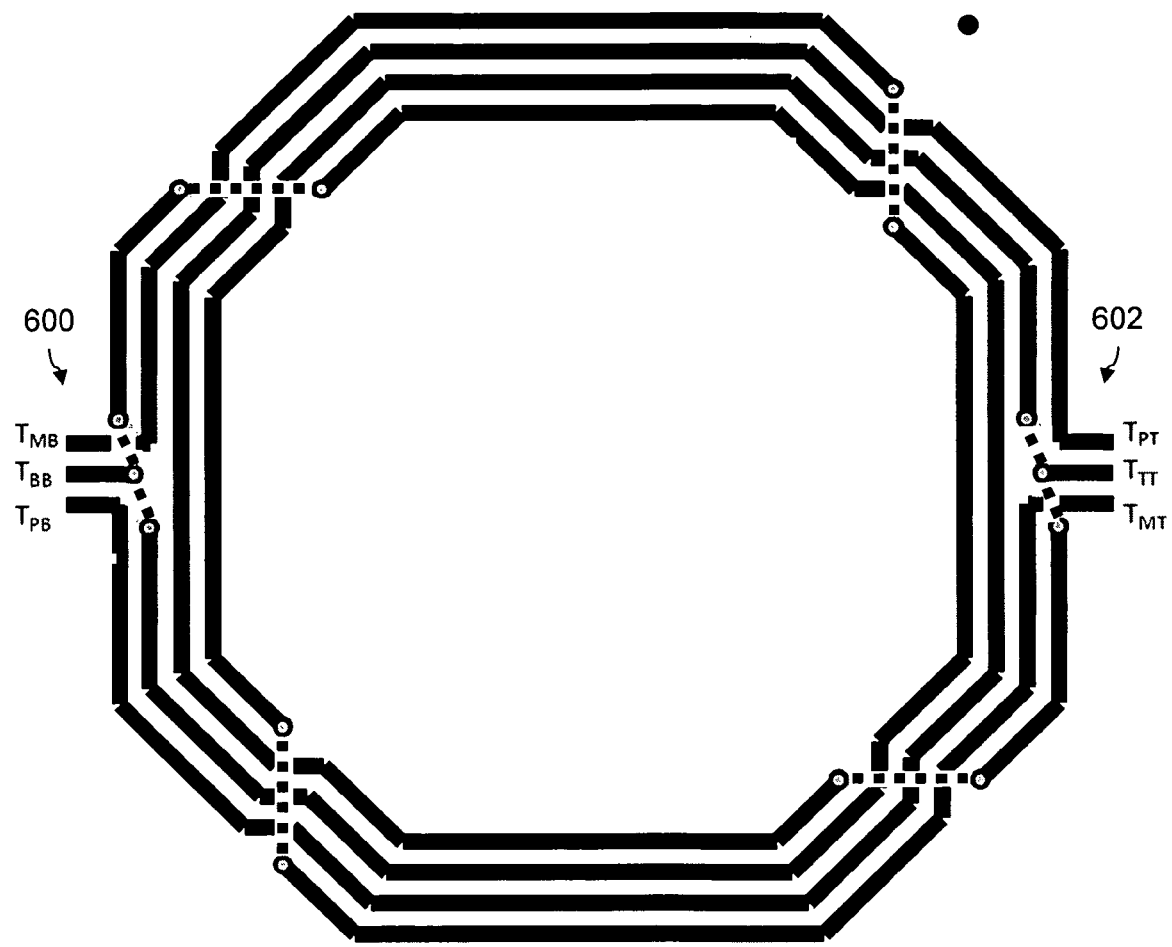
FIG. 6 is a layout showing an embodiment of two or more inductors.

FIG. 6 is a layout showing an embodiment of two or more inductors. In the example shown, nodes $T_{mb}$, $T_{bb}$, and $T_{pb}$ are on the left side (600) and nodes $T_{pt}$, $T_{tt}$, and $T_{mt}$ are on the right side (602). In some embodiments, inductors $L_t$ and $L_b$ shown in previous figures are implemented as shown. In this example, the layout shown minimizes the area occupied and maximizes the mutual inductance while only using two layers of metal. The layout is generally or substantially spiral in nature with concentric rings of metal disposed on the same surface (shown in a solid line) on one layer of metal. The second layer of metal is shown with a dotted line. Circles where the solid line meets the dotted line show vias between the two metal layers. More than two layers of metal can be used without affecting the benefits of this embodiment. The inductors in the VCO embodiments preceding this are not limited to this layout technique of the inductors and any layout may be used.

Figure 7:
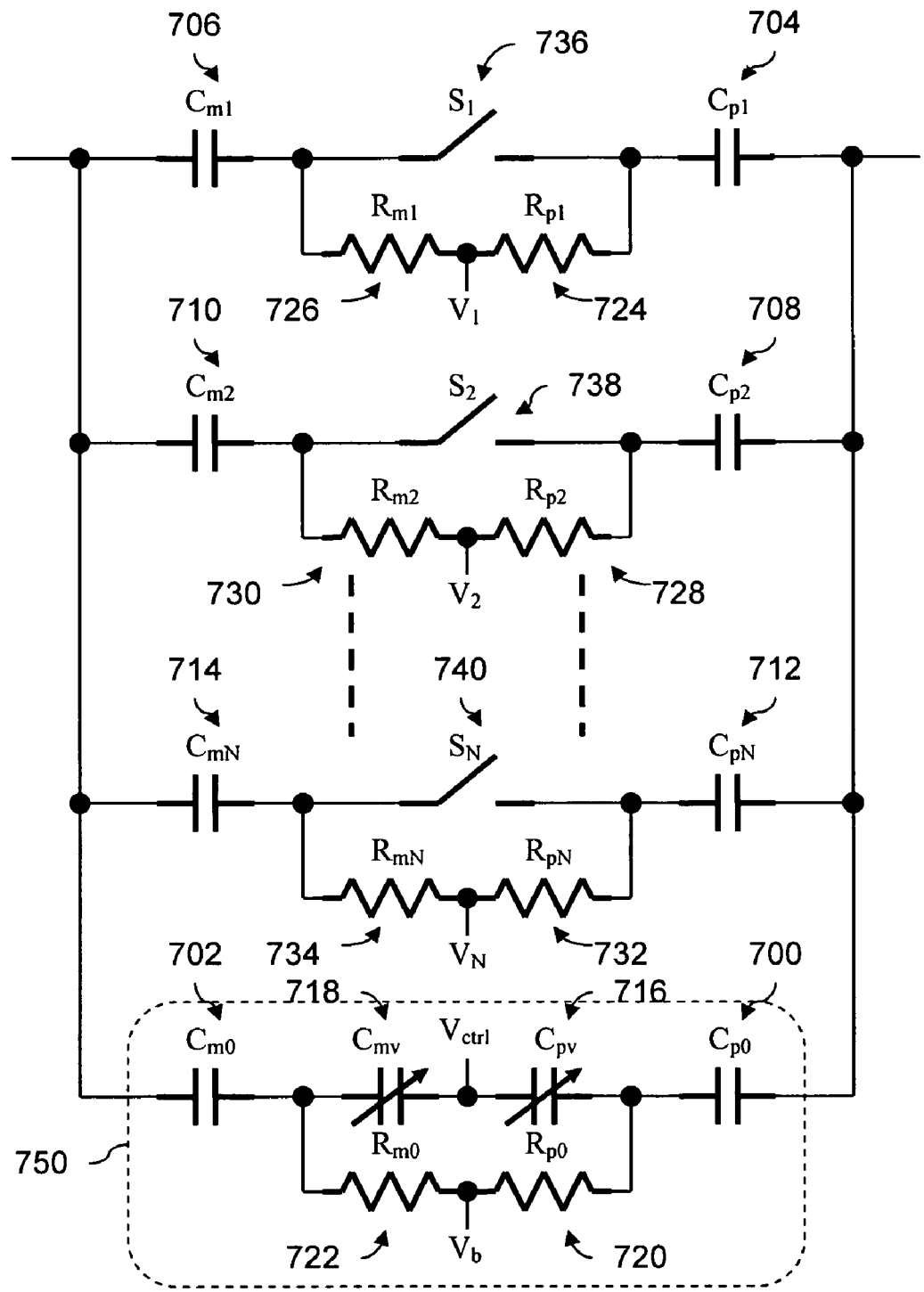
FIG. 7 is a diagram showing a first embodiment of a capacitor bank.

FIG. 7 is a diagram showing a first embodiment of a capacitor bank. In some embodiments, capacitor banks $C_t$ and/or $C_b$ shown in previous figures are implemented as shown. In some other embodiments, capacitor banks shown in previous figures are implemented in some other manner than shown herein. In some embodiments, the capacitor bank configuration shown is used in other circuits and is not necessarily limited to being used in a VCO circuit.

$C_{p1}$ (704), $C_{m1}$ (706), $C_{p2}$ (708), $C_{m2}$ (710), ..., $C_{pN}$ (712), $C_{mN}$ (714), $C_{p0}$ (700), $C_{m0}$ (702) are capacitive elements that make up the coarse tuning of the capacitor bank. There are 2*N+2 capacitors in all where N is an integer greater than zero. These capacitors may be binary weighted, thermometer weighted, geometrically weighted or any combination of weighting that may serve the purpose of covering the required range of capacitance for the desired capacitor bank.

$C_{pv}$ (716) and $C_{mv}$ (718) are varactor elements that make up a fine tuning portion of the capacitor bank. This varactor element can take on many forms including an n-type transistor in an n-well, junction diode, or any other form of capacitive element that has the property of changing the capacitance value as a function of the voltage across it.

$R_{p1}$ (724), $R_{m1}$ (726), $R_{p2}$ (728), $R_{m2}$ (730), ..., $R_{pN}$ (732), $R_{mN}$ (734), $R_{p0}$ (720), $R_{m0}$ (722) are resistor elements that are used for biasing. There are 2*N+2 resistors in all where N is an integer greater than zero. These resistors may be replaced instead with a transistor element (or some serial or parallel combination of transistor elements) that operates in a such a region that it has a close to linear current vs. voltage characteristic (e.g., the triode region in the case of the CMOS technology). In some embodiments, a combination of a transistor and resistor element is be used.

$S_1$ (736), $S_2$ (738), $S_N$ (740) are switches that are turned on or off through a digital control. These switches can be implemented in various forms including (but not limited to) an n-type transistor, a p-type transistor, or a complementary switch consisting of an n-type transistor and a p-type transistor in parallel. These switches create a low impedance connection between the two nodes when the switch is in the on state and a high impedance connection between the two nodes when the switch is in the off state.

In the example shown, there are N+1 branches connected in parallel. N of the branches in parallel consist of the following (generally from left to right in the diagram): a first capacitor (e.g., $C_{m1}$ 706), one end of which is connected to the other branches and the other end of which is connected to a switch (e.g., $S_1$ 736) and two resistors in series (e.g., $R_{m1}$ 726 and $R_{p1}$ 724). The other end of the switch (e.g., $S_1$ 736) is connected to the far end of the resistors in series (e.g., $R_{m1}$ 726 and $R_{p1}$ 724) and to a second capacitor (e.g., $C_{p1}$ 704). The other end of the second capacitor is connected to the other branches. The remaining branch (i.e., the (N+1)$^{th}$ branch) is a varactor branch.

The varactor branch (750), which consists of $C_{pv}$, $C_{mv}$, $C_{p0}$, $C_{m0}$, $R_{p0}$, and $R_{m0}$ in some embodiments is replaced by a bank of parallel branches of the same form and these branches may be weighted in some way relative to one another or they may be identical. Also, one branch may exist, but instead of one set of varactors (e.g., $C_{pv}$ and $C_{mv}$) there may be multiple varactors in parallel which may be weighted in some way relative to one another or they may be identical.

$V_{ctrl}$ is the analog control voltage that can be used to fine tune the capacitance of the capacitor bank. In some embodiments it is a digitally controlled voltage (e.g., taking on a finite set of values instead of being fully analog in nature). In the case mentioned above where there are multiple parallel varactor branches, there may be multiple $V_{ctrl}$ voltages or all the varactor branches may alternatively be controlled by one common $V_{ctrl}$.

$V_b$ is a bias voltage for the varactor.

$V_1, V_2, ..., V_N$ are voltages where N is an integer greater than 0. These voltages are set to any appropriate value. In one example, when the switch for the $i^{th}$ particular branch is in the "off" state, the corresponding voltage ($V_i$) is set to a value so as to maintain the switch in the "off" state throughout any voltage swing that is seen at the switches two terminals. $V_i$ may be set to another voltage when the $i^{th}$ switch is in the "on" state so that the impedance that the switch achieves in the "on" state is minimized.

There are a number of beneficial features to this implementation of the capacitor bank. First, by putting a capacitive element in series with the varactor element, the change in the overall capacitance of the capacitor bank ($\Delta C$) for a given change in the control voltage ($\Delta V_{ctrl}$) can be reduced. This can be useful in many applications but in particular it allows the designer of a VCO to minimize the KVCO of the oscillator. Second, this helps the linearity of the overall capacitance seen due to changes in $V_{ctrl}$ even though the varactor element is highly non-linear. Again, this can be useful in many applications but in particular it has the specific benefit in the design of PLL circuits because it allows the designer to maximize the bandwidth of the PLL and thus reduce the overall noise of the PLL. Third, $R_{p1}$, $R_{m1}$, $R_{p2}$, $R_{m2}$, ..., $R_{pN}$, $R_{mN}$, $R_{P0}$, $R_{m0}$ can be implemented using resistor elements that have very low parasitic capacitance. This will minimize the parasitic capacitances seen by the capacitor branches when the switches are in the off-state and thus allow for a higher capacitance range for the capacitor bank.

Figure 8:
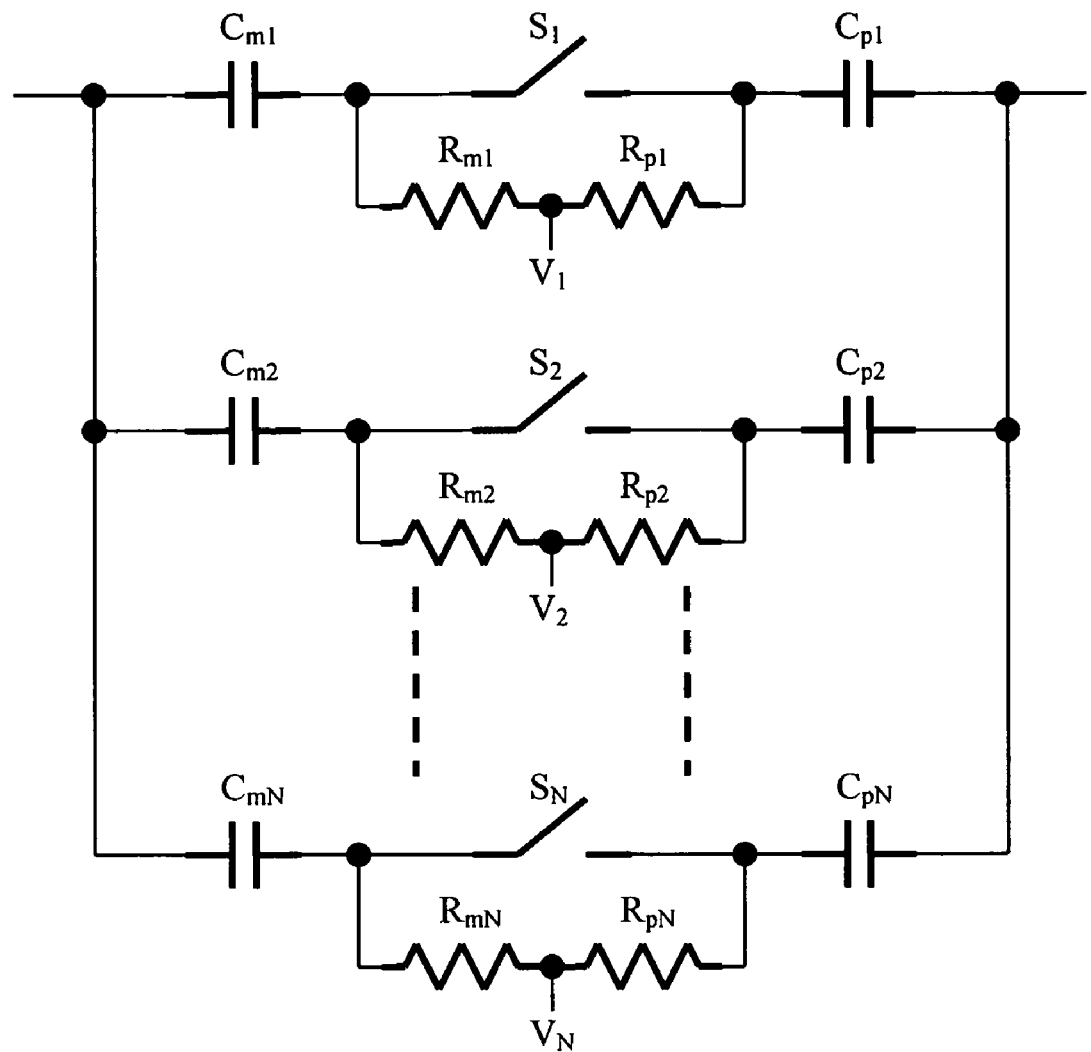
FIG. 8 is a diagram showing a second embodiment of a capacitor bank.

FIG. 8 is a diagram showing a second embodiment of a capacitor bank. The capacitor bank shown in FIG. 8 is similar to that in FIG. 7 except the varactor branch (750) has been removed. In this example, a capacitor bank is a digitally programmable capacitor bank that is useful in many applications including digitally programmable VCOs and filters.

This implementation is useful when (for example) high linearity and a wide frequency range is required from the capacitor bank but there is no requirement that the capacitor be tunable in an analog way (e.g., some granularity is acceptable).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A voltage controlled oscillator (VCO), comprising:
a first and a second n-type transistor, wherein the input of the first n-type transistor is connected to the power-facing connection of the second n-type transistor and the input of the second n-type transistor is connected to the power-facing connection of the first n-type transistor;
a first and a second p-type transistor, wherein the input of the first p-type transistor is connected to the ground-facing connection of the second p-type transistor, the input of the second p-type transistor is connected to the ground-facing connection of the first p-type transistor, the ground-facing connection of the first n-type transistor is connected to the power-facing connection of the first p-type transistor, and the ground-facing connection of the second n-type transistor is connected to the power-facing connection of the second p-type transistor;
a first capacitive element, wherein a first side of the first capacitive element is connected to the power-facing connection of the first n-type transistor and a second side of the first capacitive element is connected to the ground-facing connection of the first p-type transistor;
a second capacitive element, wherein a first side of the second capacitive element is connected to the power-facing connection of the second n-type transistor and a second side of the second capacitive element is connected to the ground-facing connection of the second p-type transistor;
a bridge connecting (1) the ground-facing connection of the first n-type transistor and power-facing connection of the first p-type transistor to (2) the ground-facing connection of the second n-type transistor and power-facing connection of the second p-type transistor;
a first inductive element, wherein a first side of the first inductive element is connected to the power-facing connection of the second n-type transistor and a second side of the first inductive element is connected to the power-facing connection of the first n-type transistor;
a first capacitor bank, wherein a first side of the first capacitor bank is connected to the power-facing connection of the second n-type transistor and a second side of the first capacitor bank is connected to the power-facing connection of the first n-type transistor;
a second inductive element, wherein a first side of the second inductive element is connected to the ground-facing connection of the second p-type transistor and a second side of the second inductive element is connected to the ground-facing connection of the first p-type transistor;
a second capacitor bank, wherein a first side of the second capacitor bank is connected to the ground-facing connection of the second p-type transistor and a second side of the second capacitor bank is connected to the ground-facing connection of the first p-type transistor.

2. The VCO recited in claim 1, wherein the first and the second n-type transistors are matched and the first and the second p-type transistors are matched.

3. The VCO recited in claim 1, wherein the first and the second n-type transistors and the first and the second p-type transistors include bipolar transistors.

4. The VCO recited in claim 1; wherein the first and the second n-type transistors and the first and the second p-type transistors include GaAs transistors.

5. The VCO recited in claim 1, wherein the first and the second n-type transistors and the first and the second p-type transistors include CMOS transistors.

6. The VCO recited in claim 1, wherein the power-facing connections of the first and second n-type transistors are drains, the inputs of the first and second n-type transistors are gates, the ground-facing connections of the first and second n-type transistors are sources, the power-facing connections of the first and second p-type transistors are sources, the inputs of the first and second p-type transistors are gates, and the ground-facing connections of the first and second p-type transistors are drains.

7. The VCO recited in claim 1, wherein the first capacitor bank and/or the second capacitor bank includes a varactor.

8. The VCO recited in claim 1, wherein the first inductive element has a center tap connected to a first side of a power bias network and a second side of the power bias network is connected to a power supply.

9. The VCO recited in claim 1, wherein the second inductive element has a center tap connected to a first side of a ground bias network and a second side of the ground bias network is connected to ground.

10. The VCO recited in claim 1, wherein the bridge includes a direct connection between (1) the ground-facing connection of the first n-type transistor and power-facing connection of the first p-type transistor and (2) the ground-facing connection of the second n-type transistor and power-facing connection of the second p-type transistor.

11. The VCO recited in claim 1, wherein the bridge includes a capacitor, wherein a first side of the capacitor is connected to the ground-facing connection of the first n-type transistor and power-facing connection of the first p-type transistor and a second side of the capacitor is connected to the ground-facing connection of the second n-type transistor and power-facing connection of the second p-type transistor.

12. The VCO recited in claim 1, wherein the bridge includes a tuning block, wherein a first side of the tuning block is connected to the ground-facing connection of the first n-type transistor and power-facing connection of the first p-type transistor and a second side of the tuning block is connected to the ground-facing connection of the second n-type transistor and power-facing connection of the second p-type transistor.

13. The VCO recited in claim 1 further comprising:
a first capacitor, wherein a first side of the first capacitor is connected to the power-facing connection of the first n-type transistor and a second side of the first capacitor is connected to the ground-facing connection of the first n-type transistor;
a second capacitor, wherein a first side of the second capacitor is connected to the ground-facing connection of the first p-type transistor and a second side of the second capacitor is connected to the power-facing connection of the first p-type transistor;
a third capacitor, wherein a first side of the third capacitor is connected to the power-facing connection of the second n-type transistor and a second side of the third capacitor is connected to the ground-facing connection of the second n-type transistor; and
a fourth capacitor, wherein a first side of the fourth capacitor is connected to the ground-facing connection of the second p-type transistor and a second side of the fourth capacitor is connected to the power-facing connection of the second p-type transistor.

14. The VCO recited in claim 1 further comprising:
a first tuning block, wherein a first side of the first tuning block is connected to the power-facing connection of the first n-type transistor and a second side of the first tuning block is connected to the ground-facing connection of the first n-type transistor;

a second tuning block, wherein a first side of the second tuning block is connected to the ground-facing connection of the first p-type transistor and a second side of the second tuning block is connected to the power-facing connection of the first p-type transistor;

a third tuning block, wherein a first side of the third tuning block is connected to the power-facing connection of the second n-type transistor and a second side of the third tuning block is connected to the ground-facing connection of the second n-type transistor; and a fourth tuning block, wherein a first side of the fourth tuning block is connected to the ground-facing connection of the second p-type transistor and a second side of the fourth tuning block is connected to the power-facing connection of the second p-type transistor.

15. The VCO recited in claim 14 further comprising:

a fifth tuning block, wherein a first side of the fifth tuning block is connected to the power-facing connection of the second n-type transistor and the second side of the fifth tuning block is connected to the input of the first n-type transistor;

a sixth tuning block, wherein a first side of the sixth tuning block is connected to the input of the second n-type transistor and the second side of the sixth tuning block is connected to the power-facing connection of the first n-type transistor;

a seventh tuning block, wherein a first side of the seventh tuning block is connected to the ground-facing connection of the second n-type transistor and the second side of the seventh tuning block is connected to the input of the first n-type transistor;

an eighth tuning block, wherein a first side of the eighth tuning block is connected to the input of the second n-type transistor and the second side of the eighth tuning block is connected to the ground-facing connection of the first n-type transistor;

a ninth tuning block, wherein a first side of the ninth tuning block is connected to the power-facing connection of the second p-type transistor and the second side of the ninth tuning block is connected to the input of the first p-type transistor;

a tenth tuning block, wherein a first side of the tenth tuning block is connected to the input of the second p-type transistor and the second side of the tenth tuning block is connected to the power-facing connection of the first p-type transistor;

a eleventh tuning block, wherein a first side of the eleventh tuning block is connected to the ground-facing connection of the second p-type transistor and the second side of the eleventh tuning block is connected to the input of the first p-type transistor; and a twelfth tuning block, wherein a first side of the twelfth tuning block is connected to the input of the second p-type transistor and the second side of the twelfth tuning block is connected to the ground-facing connection of the first p-type transistor.

16. The VCO recited in claim 15 further comprising a thirteenth tuning block, wherein a first side of the thirteenth tuning block is connected to the ground-facing connection of the first n-type transistor and power-facing connection of the first p-type transistor and a second side of the thirteenth tuning block is connected to the ground-facing connection of the second n-type transistor and power-facing connection of the second p-type transistor.

17. The VCO recited in claim 1, wherein the first capacitor bank and/or the second capacitor bank include(s):

a first and a second capacitor;

a switch; and a first and a second resistor, wherein:

one side of the first capacitor is connected to a first side of the switch and a first side of a first resistor;

a second side of the first resistor is connected to a first side of the second resistor;

and a second side of the second resistor is connected to a second side of the switch and a first side of the second capacitor.

18. The VCO recited in claim 17, wherein the first capacitor bank and/or the second capacitor bank further include(s) a varactor branch in parallel with a branch comprising of the first capacitor, the second capacitor, the switch, the first resistor, and the second resistor.

19. The VCO recited in claim 18, wherein the varactor branch includes:

a first and a second capacitor;

a first and a second varactor element; and a first and a second resistor, wherein:

one side of the first capacitor is connected to a first side of the first varactor element and a first side of the first resistor;

a second side of the first varactor element is connected to a first side of the second varactor element;

a second side of the first resistor is connected to a first side of the second resistor;

and one side of the second capacitor is connected to a second side of the second varactor element and a second side of the second resistor.

* * * * *